(12) United States Patent
Margomenos et al.

(10) Patent No.: US 6,696,645 B2
(45) Date of Patent: Feb. 24, 2004

(54) ON-WAFER PACKAGING FOR RF-MEMS

(75) Inventors: Alexandros Margomenos, Ann Arbor, MI (US); Katherine J. Herrick, Westford, MA (US); James P. Becker, Bozeman, MT (US); Linda P. B. Katehi, Northville, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/141,315

(22) Filed: May 8, 2002

(65) Prior Publication Data

US 2003/0209357 A1 Nov. 13, 2003

(51) Int. Cl.[7] .............................................. H01L 23/02
(52) U.S. Cl. ....................... 174/52.4; 174/52.3; 257/704
(58) Field of Search ............................. 174/52.1, 52.2, 174/52.4, 52.3, 266; 257/704

(56) References Cited

U.S. PATENT DOCUMENTS

| | | | | |
|---|---|---|---|---|
| 4,613,891 A | * | 9/1986 | Ng et al. ..................... | 257/777 |
| 6,127,629 A | * | 10/2000 | Sooriakumar et al. ...... | 174/52.3 |
| 6,207,903 B1 | | 3/2001 | Wen et al. .................. | 174/253 |
| 6,303,986 B1 | * | 10/2001 | Shook ......................... | 257/680 |
| 6,359,333 B1 | * | 3/2002 | Wood et al. ................ | 257/704 |
| 2002/0127768 A1 | * | 9/2002 | Badir et al. ................. | 438/106 |

OTHER PUBLICATIONS

J.P. Becker and L.P.B. Katehi, "Multilevel Finite Ground Coplanar Line Transitions for High–Density Packaging Using Silicon Micromachining", 2000 IEEE MTT–S International Microwave Symposium Digest, Boston, MA, Jun. 2000, pp. 303–306.

S.P. Pacheco, L.P.B. Katehi, and C.T.C. Nguyen, "Design of Low Actuation Voltage RF MEMS Switch", 2000 IEEE MTT–S International Microwave Symposium Digest, Boston, MA, Jun. 2000, pp. 167–170.

J. Kennedy, "Surface Mount Components Reduce Broadband Equipment Costs", Applied Microwave and Wireless, vol. 13, No. 1, Jan. 2001, pp. 102–108.

K.H. Herrick, J.–G. Yook, S.V. Robertson, G.M. Rebeiz, and L.P.B. Katehi, "W–band Micromachined Vertical Interconnection for Three–Dimensional Microwave ICs", 29th European Microwave Conference Proceedings, Munich Germany, Oct. 1999, pp. 402–405.

* cited by examiner

*Primary Examiner*—Hung V. Ngo
(74) *Attorney, Agent, or Firm*—Harness, Dickey & Pierce, P.L.C.

(57) ABSTRACT

An RF micro-electro-mechanical system including a first silicon wafer having a top surface and a bottom surface. The top surface being opposite the bottom surface. A bore extends through the first silicon wafer. A micro-electro-mechanical device is provided and coupled to the top surface of the first silicon wafer. An electrical feed line then extends along the bottom surface of the first silicon wafer and an electrical interconnect electrically couples the micro-electro-mechanical device and the electrical feed line through the bore.

14 Claims, 6 Drawing Sheets

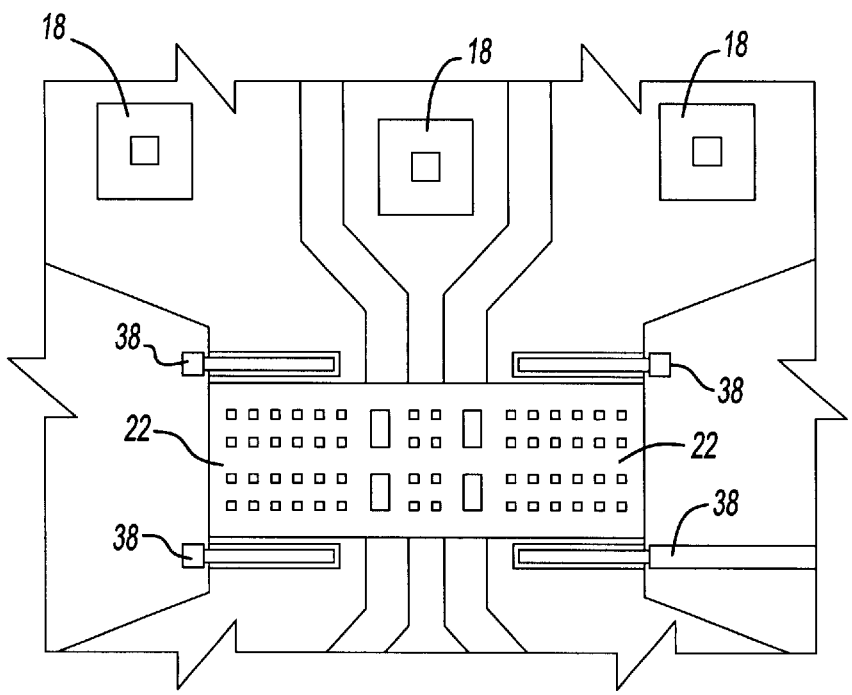
Fig-3
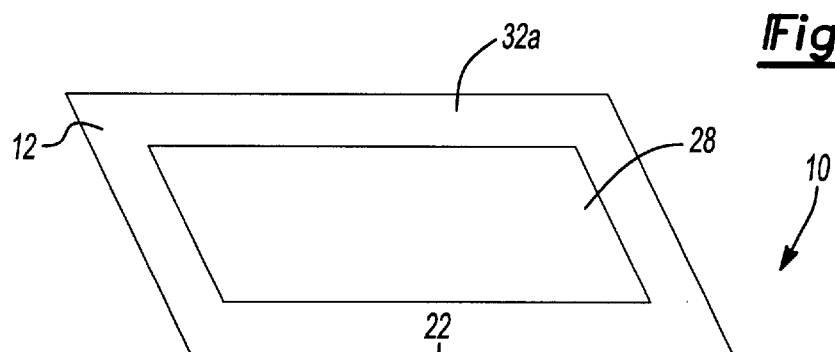
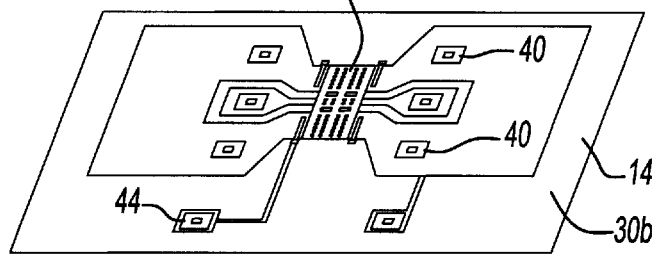
Fig-4
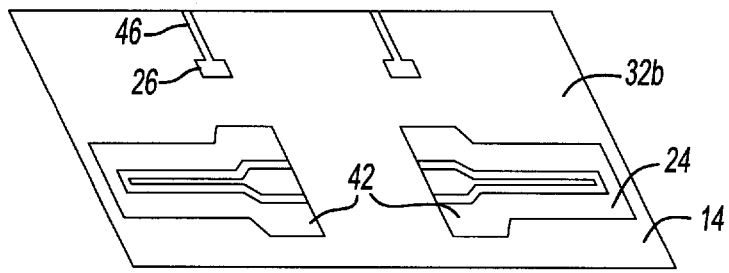

US 6,696,645 B2

ON-WAFER PACKAGING FOR RF-MEMS

STATEMENT OF GOVERNMENTAL SUPPORT

This invention was made with Government support under Grant No. ECS-9979374 awarded by the National Science Foundation and Grant No. 2001-0694-02 awarded by the U.S. Army. The government has certain rights in this invention.

FIELD OF THE INVENTION

The present invention generally relates to RF MEMS switches and, more particularly, to a RF MEMS switch that provides lower loss and better performance in K-band and further provides a method of fabrication of the RF MEMS package with all components on a single wafer without the need for external wires.

BACKGROUND OF THE INVENTION

Integrated circuit (IC) packaging and testing has evolved over the past years due to the maturity of the IC industry, the availability of highly advanced infrastructure, and the wide applicability of the integrated circuits. In general, the goal for IC packaging is to provide an electrical interface to active chips in the system, to supply signal power and ground interconnections, to facilitate heat dissipation, and to at least partially protect the chips from the environment.

On the other hand, the requirements of micro electro mechanical systems (MEMS) packaging are different from those of IC packaging in that MEMS packaging requirements are application specific and, thus, different designs are used for different circuits. This lack of standardization leads to excessive cost associated with MEMS products.

Similarly, millimeter wave systems for commercial, scientific, or military applications are rapidly emerging that require development of packaging technologies that are capable of shielding high radio frequencies. For example, the performance requirements for high-density, high frequency (i.e. 5–100 GHz) packages are very stringent, since poor design and fabrication can lead to increased cavity resonances and cross-talk between neighboring circuits. Although many low cost materials can be utilized for packaging, such as plastic and alumina, these materials typically suffer from poor electrical performance at frequencies beyond 10 GHz.

Silicon on the other hand has been extensively used and studied in the electronics industry. Its electrical properties have enabled the semiconductor industry to use it as the primary dielectric material in developing integrated circuits, while its mechanical properties have been utilized to develop high performance micro-electro-mechanical system (MEMS) structures.

SUMMARY OF THE INVENTION

According to the teachings of the present invention, an RF micro-electro-mechanical system is provided having an advantageous construction. The RF MEMS system includes a first silicon wafer having a top surface and a bottom surface. The top surface is opposite the bottom surface. A bore extends through the first silicon wafer. A micro-electro-mechanical device is provided and coupled to the top surface of the first silicon wafer. An electrical feed line then extends along the bottom surface of the first silicon wafer and an electrical interconnect electrically couples the micro-electro-mechanical device and the electrical feed line through the bore.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3 is an enlarged plan view illustrating the RF MEMS switch assembly with the top wafer removed for clarity FIG. 4 is a perspective view of the RF MEMS switch assembly illustrating the bottom side of the top wafer, the top side of the bottom wafer, and the bottom side of the bottom wafer;

DETAILED DESCRIPTION OF THE PREFERRED EMBODIMENTS

The following description of the preferred embodiments is merely exemplary in nature and is in no way intended to limit the invention, its application, or uses.

Figure 1:
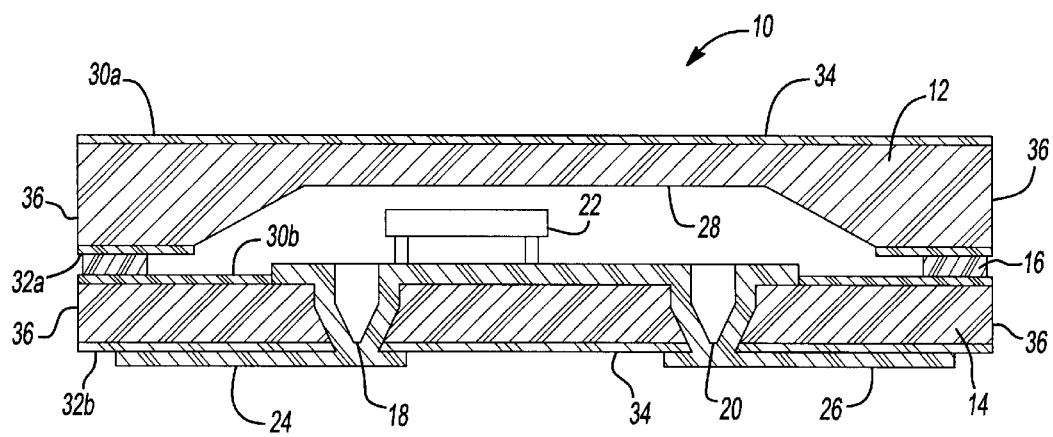
FIG. 1 is a cross-sectional view illustrating an RF MEMS switch assembly according to a first embodiment of the present invention.

Referring to FIG. 1, an RF MEMS switch assembly 10 is illustrated according to the principles of the present invention. RF MEMS switch assembly 10 generally includes a top wafer 12 and a bottom wafer 14, which are generally bonded together about their peripheral edge at bond 16. In the exemplary embodiment appropriate through-wafer interconnects extend through bottom wafer 14. More particularly, these through-wafer interconnects include an RF interconnect 18 and a direct current (DC) interconnect 20. As will be described in detail, RF interconnect 18 and DC interconnect 20 are electrically coupled to a MEMS switch or other device 22 and, thus, provide the necessary RF feed and DC feed to MEMS switch 22.

RF MEMS switch assembly 10 further includes an RF feed line 24 electrically coupled to RF interconnect 18 and a DC feed line 26 electrically coupled to DC interconnect 20. RF feed line 24 and DC feed line 26 formed (or printed) on a side opposite of MEMS switch 22 on bottom wafer 14.

Preferably, top wafer 12 includes a cavity 28 formed along bottom side 32a that is sized to accommodate MEMS switch 22. Moreover, in this embodiment it is preferable that top wafer 12 and bottom wafer 14 are each a high-resistivity, double-side polished silicon wafers having a 8700 Å $SiO_2$ layer 34 disposed on top sides 30a, 30b and bottom sides 32a, 32b. However, it should be appreciated that the teachings of the present invention should not be regarded as being limited to the specific wafer composition and arrangement disclosed in this exemplary embodiment. Still further, it is preferable that bond 16 is made of a gold, gold/chrome, or platinum material. However, any bonding material sufficient to achieve and maintain a satisfactory bond may be used.

RF interconnect 18 and DC interconnect 20 provide advantages over known designs, such as, but not limited to, excellent electrical performance in K-band. That is, RF MEMS switch assembly 10 is capable of an insertion loss of 0.1 dB and a return loss of 32 dB at 20 GHz. Moreover, RF MEMS switch assembly 10 is manufactured concurrently with MEMS switch 22 on bottom wafer 14 and includes vertical electrical interconnections. Therefore, RF MEMS switch assembly 10 does not require solder bumps or bond wires to achieve signal propagation, which is a signature of conventional systems.

Fabrication

Fabrication of RF MEMS switch assembly 10 is a multiphase process involving both surface and bulk micromachining. As described above, top wafer 12 and bottom wafer 14 are preferably high-resistivity double-side polished silicon wafers. In the present embodiment, top wafer 12 is 200 $\mu$m thick and bottom wafer 14 is 100 $\mu$m thick. $SiO_2$ layer 34 is thermally deposited on top side 30a, 30b and bottom side 32a, 32b of top wafer 12 and bottom wafer 14, respectively, to allow for dual side processing. A 500/9500 Å Cr/Au layer 36 is deposited on bottom wafer 14 using a conventional lift-off process in order to form RF feed lines 24 and DC feed lines 26. $SiO_2$ is then patterned on top side 30b of bottom wafer 14 using infrared (IR) alignment and then etched fully in buffered hydrofluoric acid (BHF) at a rate of 1000 Å/min. Oxide-patterned RF interconnect 18 and DC interconnect 20 are etched in potassium hydroxide (KOH) at an etch rate of 30 Å/min. Finally, RF feed line 24, DC feed line 26, RF interconnect 18, and DC interconnect 20 are then metallized. A Cr/Au layer is deposited around the peripheral edge 36 of each wafer 12, 14 to be used for thermocompression bonding to form bond 16.

Figure 2:
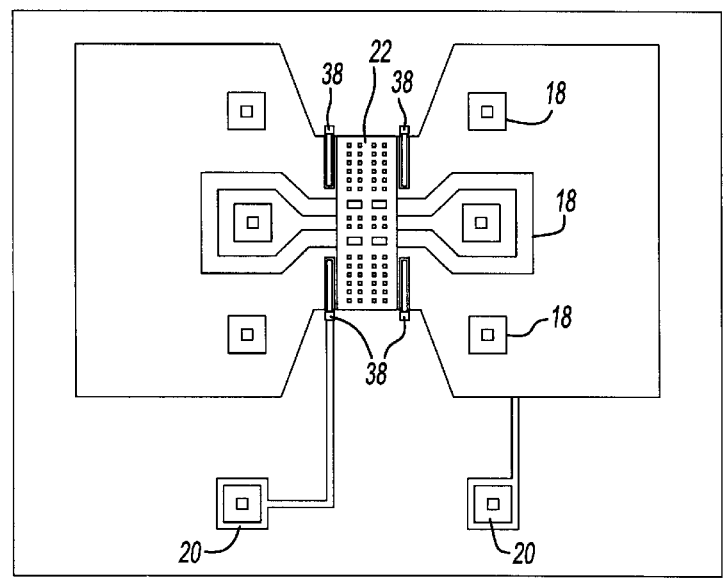
FIG. 2 is a plan view illustrating the RF MEMS switch assembly with the top wafer removed for clarity.

Fabrication of MEMS switch 22 requires an independent five mask process of top side 30b of bottom wafer 14. It should be noted that in order to facilitate further processing of bottom wafer 14, bottom wafer 14 may be mounted on a glass slide using photoresist (SHIPLEY PR-1827). However, it should be understood that this step is optional. The method of manufacturing MEMS switch 22 includes first depositing 2000 Å of plasma enhanced chemical vapor deposition (PECVD) silicon nitride in a predetermined patterned over the location where MEMS switch 22 is to be placed. A sacrificial layer of 3 $\mu$m thick polyimide (DUPONT PI2545) is then spun cast, soft baked, and patterned to define anchor points 38 for MEMS switch 22 (see FIG. 2) for anchor points. To define the structure of MEMS switch 22, 2 $\mu$m of Ni is electroplated upon bottom wafer 22. Furthermore, 4 $\mu$m of Ni is selectively electroplated on the switch actuation pads. Sacrificial etching of the 3 $\mu$m thick polyimide layer and supercritical $CO_2$ drying and release of MEMS switch 22 is performed. MEMS switch 22 is shown in FIG. 3 where a scanning electron image of MEMS switch 22 and the RF interconnect is presented.

Cavity 28 is then etched on top wafer 12. The fabrication process steps are similar to the steps set forth above. That is, (a) a lift-off process is used for the metallization of Cr/Au (500/9500 Å) to fabricate a square metallic rim on underside 32a of top wafer 12; (b) $SiO_2$ is patterned on both sides of top wafer 12 using infrared (IR) alignment to define cavities and probe windows for the final alignment of top wafer 12 and bottom wafer 14 prior to bonding; (c) $SiO_2$ is then etched partially or fully in buffered hydrofluoric acid (BHF) at a rate of 1000 Å/min; and finally (d) the oxide-patterned cavities and probe windows are anisotropically etched in potassium hydroxide (KOH) at a rate of 30 Å/hour.

Thermocompression bonding of top wafer 12 and bottom wafer 14 is performed with an ELECTRONIC VISIONS EV 501 Manual Wafer Bonder. Initially, top wafer 12 and bottom wafer 14 are cleaned with organic solvents in order to prevent any surface contamination. Once aligned, using appropriate alignment marks and probe windows, top wafer 12 and bottom wafer 14 are clamped together in the bond fixture and are heated to 350° C. A force of 200 N is applied to top wafer 12 and bottom wafer 14 for 30 minutes in order to achieve proper adhesion.

With particular reference to FIG. 4, RF MEMS switch assembly 10 is illustrated in an accordion fashion to illustrate bottom side 32a of top wafer 12, top side 30b of bottom wafer 14, and bottom side 32b of bottom wafer 14. As can be seen, top wafer 12 includes cavity 28 disposed along bottom side 32a of top wafer 12. Similarly, bottom wafer 14 includes the plurality of RF interconnects 18 and DC interconnects 20. A top side 40 of RF interconnect 18 is shown on top side 30b of bottom wafer 14. A bottom side 42 of RF interconnect 18 is shown on bottom side 32b of bottom wafer 14. Likewise, a top side 44 of DC interconnects 20 is shown on top side 30b of bottom wafer 14. A bottom side 46 of DC interconnects 20 is shown on bottom side 32b of bottom wafer 14. RF feed line 24 is shown being electrically coupled to bottom side 42 of RF interconnect 18 and a DC feed line 26 is shown being electrically coupled to bottom side 46 of DC interconnect 20. DC interconnects 20 are connected to the FGC ground plane and to anchor points 38. The distance between RF interconnect 18 and MEMS switch 22 is approximately 200 $\mu$m in the lateral direction.

Figure 7:
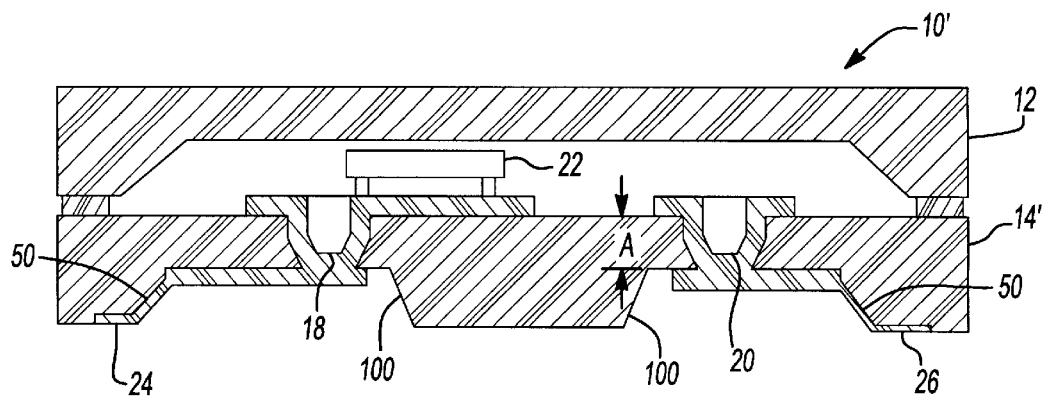
FIG. 7 is a cross-sectional view illustrating an RF MEMS switch assembly according to a second embodiment of the present invention.
Figure 8:
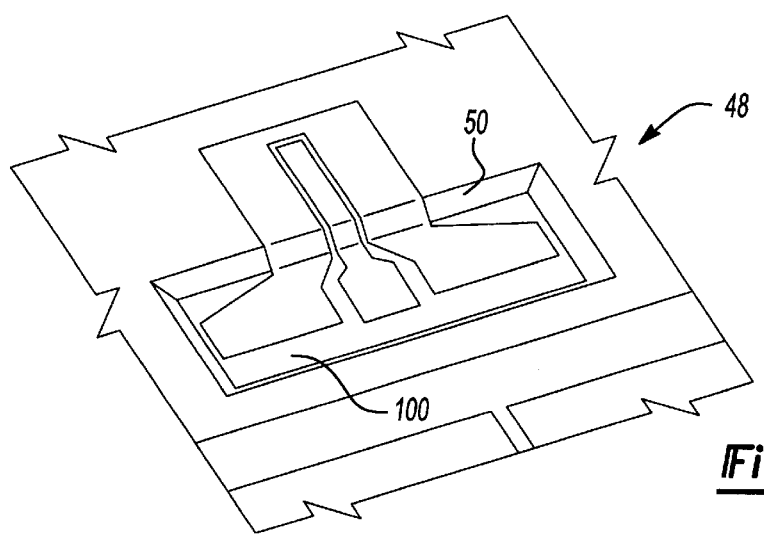
FIG. 8 is a perspective view illustrating an interconnect along an inclined plane of a cavity formed on the bottom wafer.
Figure 9:
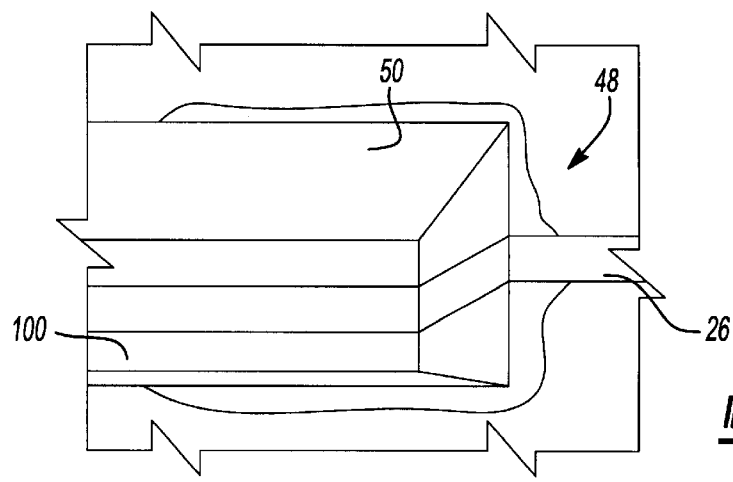
FIG. 9 is an enlarged perspective view illustrating the interconnect along the inclined plane of the cavity formed on the bottom wafer.

Referring now to FIGS. 7–9, an FGC interconnect 48 is illustrated that is employed to interconnect RF feed line 24 and DC feed line 26 along an inclined plane 50 according to a second embodiment of the present invention. This second embodiment provides a method of achieving the favorable properties set forth in regard to the first embodiment when bottom wafer 14 is more than 100 $\mu$m thick. In this example, a bottom wafer 14' is illustrated having a thickness of 200 $\mu$m. Accordingly, a cavity 100 is formed in bottom wafer 14'. Preferably, cavity 100 is sized to reduce a through thickness A to approximately 100 $\mu$m.

More particularly, FGC interconnect 48 is fabricated by anisotropic etching of bottom wafer 14' and photolithographic patterning of electrophoretically deposited photoresist. That is, bottom wafer 14' is anisotropically etched in tetramethyl ammonium hydroxide (TMAH). TMAH is preferred over potassium hydroxide, since it produces smoother walls in cavity 100. For the electrophoretic deposition, bottom wafer 14' is coated with a metallic seed layer and is then immersed into a bath of suitable photoresist, such as SHIPLEY PEPR 2400. A potential difference is then applied between bottom wafer 14' and a counter electrode (not shown), to produce FGC interconnect 48. The quality and thickness of the photoresist coverage are dependent on the bath temperature, the resist concentration, and the deposition voltage. Following deposition, the desired pattern is exposed with a conventional mask aligner and developed. A lift-off technique is then utilized to achieve the final metal deposition.

Measured Results

Figure 5:
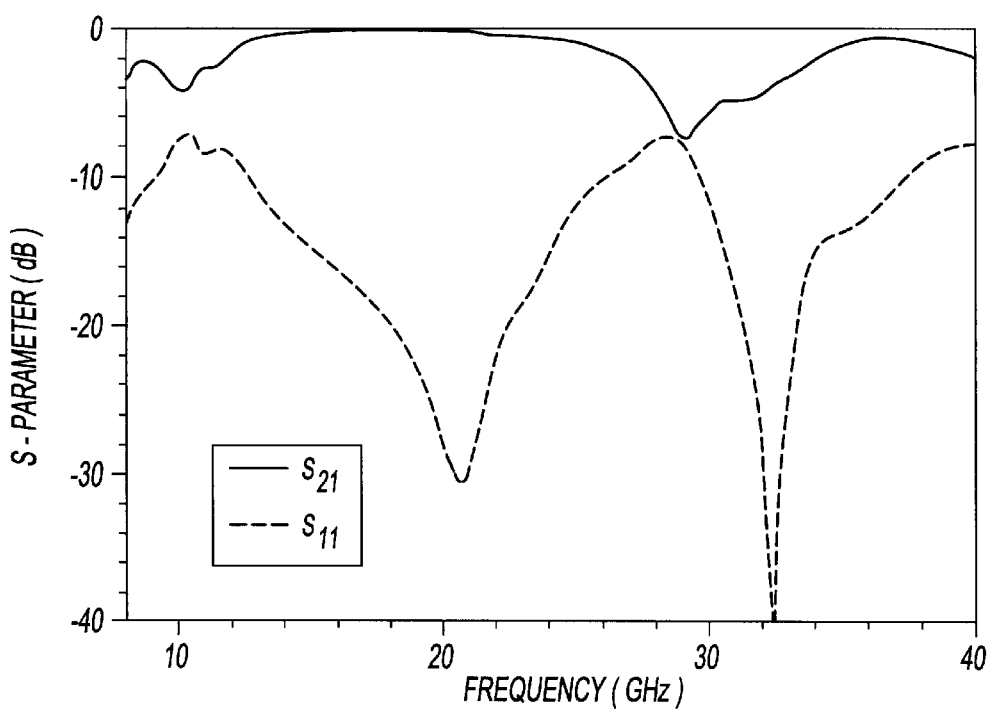
FIG. 5 is a graph illustrating the measured response of the RF interconnect.

Referring to FIG. 5, a graph is shown illustrating the measured S-parameter (dB) of RF interconnect 18 versus the applied frequency. For these measurements, an HP 8510C vector network analyzer is utilized on an ALESSI probe station with 150 $\mu$m pitch GGB picoprobes. Through-Reflect-Line (TRL) calibration is performed using on wafer calibration standards fabricated in conjunction with the circuits to be tested. MULTICAL, developed by NIST, is used to implement the TRL calibration. After deembeding the loss of the FGC feeding line, RF interconnect 18 demonstrates a 0.1 dB insertion loss, a 32 dB return loss at 20 GHz, and a 55% bandwidth. Thus, the loss due to each interconnect 18, 20 is approximately 0.05 dB.

Figure 6:
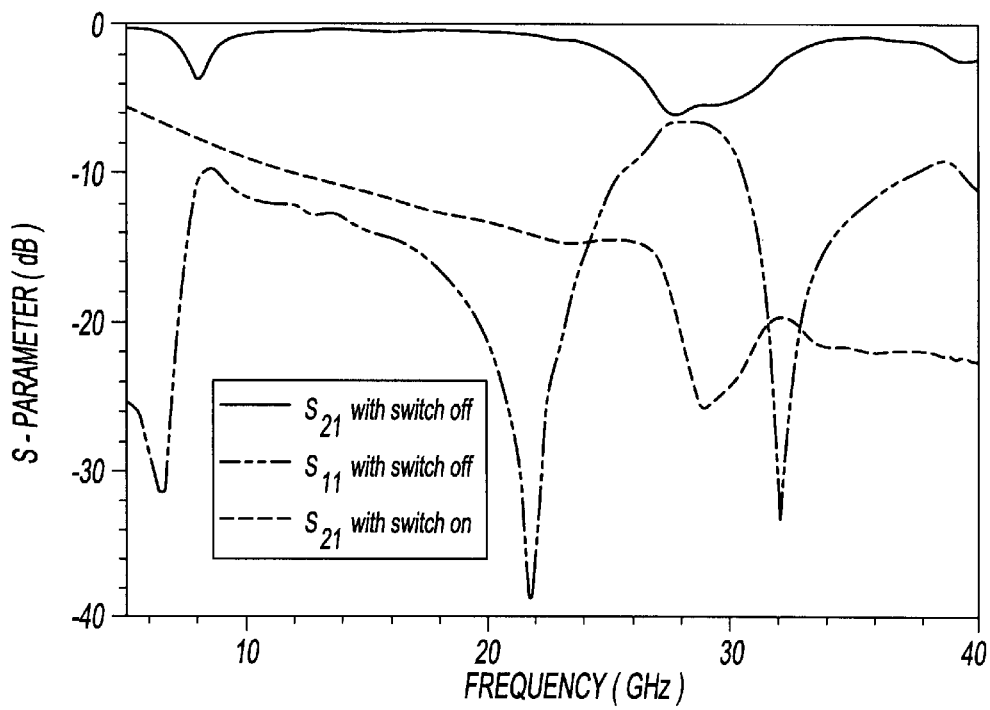
FIG. 6 is a graph illustrating the measured response of RF MEMS switch assembly.

Referring now to FIG. 6, the measured response of RF MEMS switch assembly 10 can been seen. When MEMS switch 22 is in an up position, its capacitance is 38 fF and, therefore, has only a minor effect on the response of the circuit. The loss due to individual MEMS switch 22 is on the order of 0.16 dB at 40 GHz and, hence, the insertion loss of the total circuit of RF MEMS switch assembly 10 is increased by only a small amount.

When MEMS switch 22 is in the down position its capacitance increases to 1.6 pF (as can be seen by the S-parameter). The isolation of RF MEMS switch assembly 10 is approximately −22 dB at 40 GHz. As can be seen in FIG. 6, resonance occurs at around 29 GHz, which degrades the performance of RF MEMS switch assembly 10 in both the up and down positions. Comparing the measurements illustrated in FIGS. 5 and 6, it can be seen that the operational frequency band for RF MEMS switch assembly 10 is between 11 and 24 GHz, with an insertion loss of 0.15 dB (switch loss included) and an isolation of −16 dB at 24 GHz.

As described above, packaging of high frequency MEMS devices is often challenging since achieving signal distribution and environmental protection requires careful design and fabrication. RF MEMS switch assembly 10 of the present invention provides a method for overcoming such challenges. Particularly, RF MEMS switch assembly 10 demonstrates an insertion loss of 0.1 dB and a return loss of 32 dB at 20 GHz, which was unattainable until now.

Figure 10:
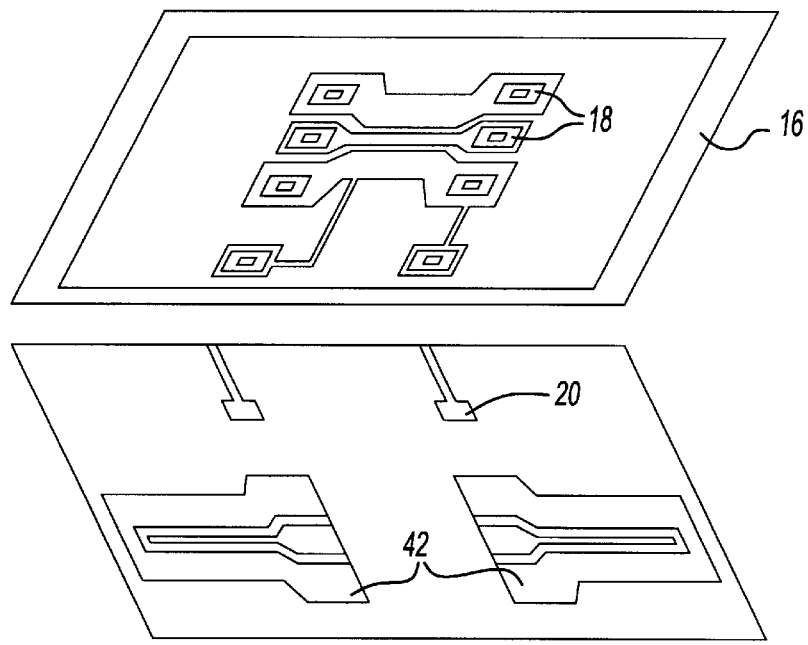
FIG. 10 is a perspective view of the RF MEMS switch assembly illustrating the top side of the bottom wafer and the bottom side of the bottom wafer according to another embodiment of the present invention.
Figure 11:
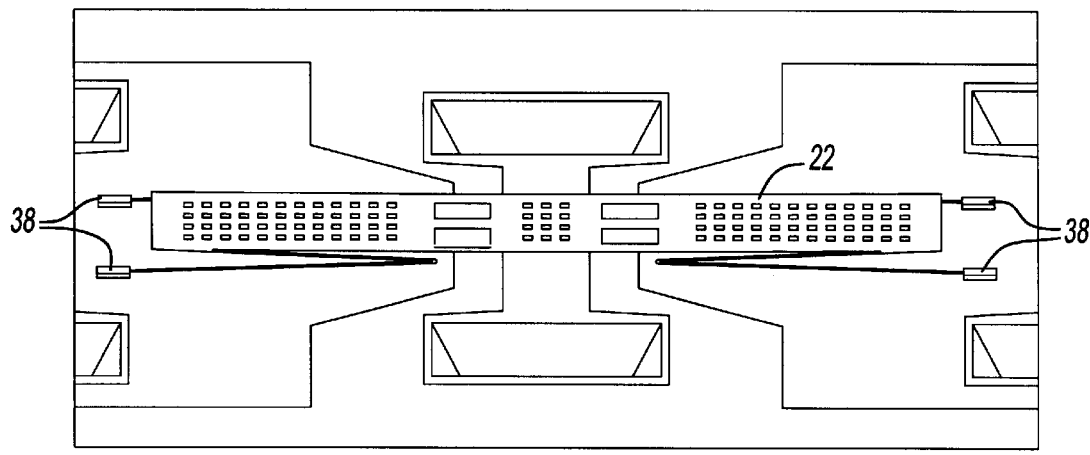
FIG. 11 is a perspective view illustrating the RF MEMS switch assembly having a MEMS switch fabricated thereon.
Figure 12:
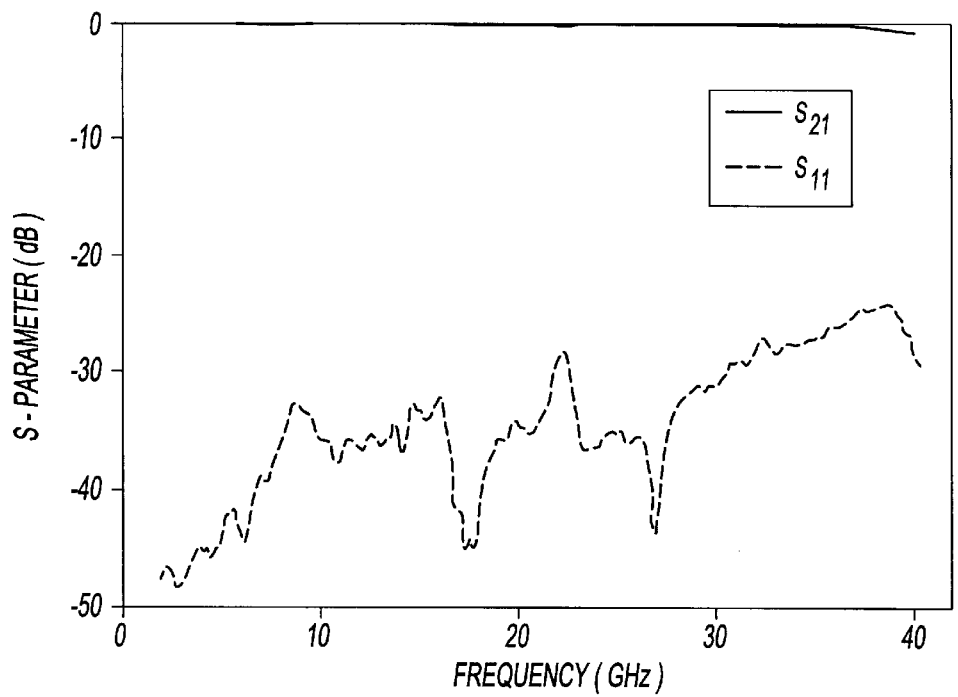
FIG. 12 is a graph illustrating the measured response of the RF inconnect before fabricating the MEMS switch.
Figure 13:
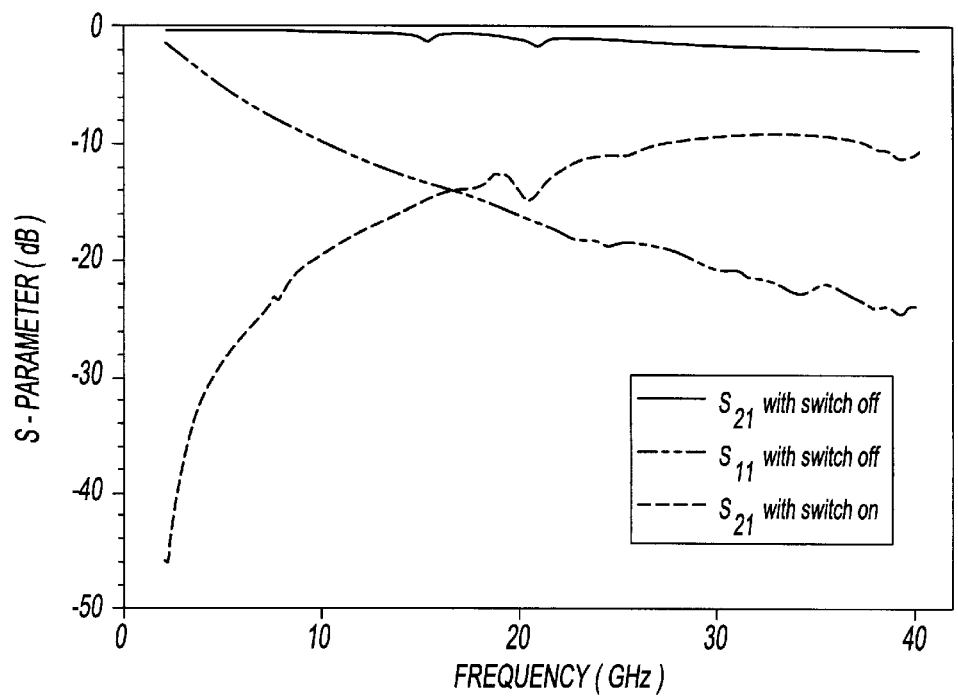
FIG. 13 is a graph illustrating the measured response of the RF interconnect after fabricating the MEMS switch.

In order to increase the operational bandwidth of RF MEMS switch assembly 10, a new interconnect is provided. Again the concept of interconnecting from a 50 $\Omega$ FGC line (50-80-50 $\mu$m) to a much wider 50 $\Omega$ FGC line (90-220-90 $\mu$m) in order to allow for the anisotropic etching of the interconnects is adhered to. However, it should be understood that by removing the stubs that have been previously used to tune the transition, a much broader response is achievable. This new interconnect is illustrated in FIGS. 10 and 11, while the response is illustrated in FIGS. 12 and 13. Specifically, FIG. 10 illustrates the top side of the bottom wafer and the bottom side of the bottom wafer. As can be appreciated from the graphs of FIGS. 12 and 13, this new interconnect can be operated from 0–50 GHz and has no unwanted resonances.

The measured response of the vertical back-to-back transition is displayed in FIG. 12. The package demonstrates an operation bandwidth from DC-40 GHz with a return loss lower than −25 dB throughout the band. The measuresments summarized in FIGS. 12 and 13 include a 2700 $\mu$m through line, therefore the total insertion loss is about 0.4 dB at 38 GHz. If the losses from the FGC feeding lines are deembedded, the transition demonstrates a 0.06 dB loss up to 40 GHz and, thus, the loss die to each individual via transition is insignificant and approximately 0.03 dB. Taking into account the fact that no external wire bonding is needed in order to achieve signal propagation, this is the only loss introduced by the present invention.

Referring now to FIG. 13, the measured response of the complete RF transition and MEMS switch in both the up and down position is illustrated. The up-capacitance of the switch, as extracted from the S-parameters, is 70 fF. This capacitance introduces a loss of approximately 0.3 dB at 20 GHz. The return loss at higher frequencies is increased due to the capacitance introduced by the switch, however it remains below −10 dB up to 40 GHz. When the switch is in the down position, its capacitance increases to 1.9 pF (as can be extracted from the S-parameters) and the measured isolation is approximately −23 dB at 40 GHz. These measured results illustrate that the broad bandwidth of this package renders it applicable for both low and high frequency MEMS devices.

MEMS technology has major applications in developing smaller, faster and less energy consuming devices provided that reliability of packaging and interconnection technology is sufficiently addressed. The present invention presents a low cost, on-wafer, silicon micromachined packaging scheme for RF MEMS switches having excellent electrical performance in K-band.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An RF micro-electro-mechanical system comprising:
   a first silicon wafer having a first surface and a second surface, said first surface being opposite said second surface;
   a bore extending through said first silicon wafer;
   a micro-electro-mechanical device coupled to said first surface of said first silicon wafer;
   an electrical feed line extending along said second surface of said first silicon wafer;
   an electrical interconnect electrically coupling said micro-electro-mechanical device and said electrical feed line through said bore; and
   a second silicon wafer bonded to said first silicon wafer.

2. The RF micro-electro-mechanical system according to claim 1, further comprising:
   a cavity formed in said second silicon wafer, said cavity being positioned adjacent said micro-electro-mechanical device.

3. The RF micro-electro-mechanical system according to claim 1, further comprising:
   a cavity formed in said second surface of said first silicon wafer, said cavity being adjacent said bore to reduce a length of said bore.

4. The RF micro-electro-mechanical system according to claim 3, wherein said cavity includes a base surface and an inclined sidewall extending between said base surface and said second surface of said first silicon wafer, said electrical feed line extending along said second surface of said first silicon wafer, said inclined sidewall, and said base surface.

5. The RF micro-electro-mechanical system according to claim 1, wherein the RF micro-electro-mechanical system has an operational bandwidth in the range of about 0 to 40 GHz, with a return loss of better than about −25 dB up to about 40 GHz and an insertion loss of about 0.4 dB at 38 GHz.

6. The RF micro-electro-mechanical system according to claim 1 wherein said electrical interconnect includes less than about 0.03 dB loss up to about 40 GHz.

7. An RF micro-electro-mechanical system comprising:
   a first substrate having a first surface and a second surface, said first surface being opposite said second surface;
   a bore extending through said first substrate;
   a micro-electro-mechanical device fixedly coupled to said first surface of said first substrate;
   an electrical feed line extending along said second surface of said first substrate;
   an electrical interconnect electrically coupling said micro-electro-mechanical device and said electrical feed line through said bore; and
   a first cavity formed in said second surface of said first substrate, said first cavity having a base surface adjacent said bore and an inclined sidewall extending between said base surface and said second surface of said first substrate, said electrical feed line extending along said second surface of said first substrate, said inclined sidewall, and said base surface.

8. The RF micro-electro-mechanical system according to claim 7, further comprising:
   a second substrate bonded to said first substrate.

9. The RF micro-electro-mechanical system according to claim 8, further comprising:
   a second cavity formed in said second substrate, said second cavity being positioned adjacent said micro-electro-mechanical device.

10. The RF micro-electro-mechanical system according to claim 7 wherein the RF micro-electro-mechanical system has an operational bandwidth in the range of about 0 to 40 GHz, with a return loss of better than about −25 dB up to about 40 GHz and an insertion loss of about 0.4 dB at 38 GHz.

11. The RF micro-electro-mechanical system according to claim 7 wherein said electrical interconnect includes less than about 0.03 dB loss up to about 40 GHz.

12. An RF micro-electro-mechanical system comprising:
   a first substrate having a first surface and a second surface, said first surface being opposite said second surface;
   a bore vertically extending through said first substrate;
   a micro-electro-mechanical device fixedly coupled to said first surface of said first substrate;
   an electrical feed line extending along said second surface of said first substrate;
   an interconnect electrically coupling said micro-electro-mechanical device and said electrical feed line through said bore;
   a first cavity formed in said second surface of said first substrate, said first cavity having a base surface adjacent said bore and an inclined sidewall extending between said base surface and said second surface of said first substrate, said electrical feed line extending along said second surface of said first substrate, said inclined sidewall, and said base surface;
   a second substrate bonded to said first substrate; and
   a second cavity formed in said second substrate, said second cavity being positioned adjacent said micro-electro-mechanical device.

13. The RF micro-electro-mechanical system according to claim 12 wherein the RF micro-electro-mechanical system has an operational bandwidth in the range of about 0 to 40 GHz, with a return loss of better than about −25 dB up to about 40 GHz and an insertion loss of about 0.4 dB at 38 GHz.

14. The RF micro-electro-mechanical system according to claim 12 wherein said interconnect includes less than about 0.03 dB loss up to about 40 GHz.

* * * * *